(12) United States Patent
De Graaf

(10) Patent No.: US 7,701,551 B2
(45) Date of Patent: Apr. 20, 2010

(54) LITHOGRAPHIC APPARATUS AND DEVICE MANUFACTURING METHOD

(75) Inventor: Silvester De Graaf, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 225 days.

(21) Appl. No.: 11/404,108

(22) Filed: Apr. 14, 2006

(65) Prior Publication Data

US 2007/0243329 A1   Oct. 18, 2007

(51) Int. Cl.
  *G03B 27/42* (2006.01)
(52) U.S. Cl. .............................. 355/53; 355/30; 355/72
(58) Field of Classification Search ................... 355/53, 355/72
  See application file for complete search history.

(56) References Cited

U.S. PATENT DOCUMENTS

| 4,509,852 | A  |   | 4/1985  | Tabarelli et al. |       |
|-----------|----|---|---------|------------------|-------|
| 2004/0136494 | A1 |   | 7/2004  | Lof et al.       |       |
| 2004/0207824 | A1 |   | 10/2004 | Lof et al.       |       |
| 2004/0263809 | A1 | * | 12/2004 | Nakano           | 355/30 |
| 2005/0018155 | A1 | * | 1/2005  | Cox et al.       | 355/30 |
| 2005/0219490 | A1 |   | 10/2005 | Owa              |       |
| 2005/0253090 | A1 |   | 11/2005 | Gau et al.       |       |
| 2006/0023183 | A1 |   | 2/2006  | Novak et al.     |       |

FOREIGN PATENT DOCUMENTS

| DE | 221563 A1 * | 4/1985 |
| EP | 1 420 300 A2 | 5/2004 |
| EP | 1 420 300 A3 | 8/2005 |
| WO | 99/49504 | 9/1999 |
| WO | WO 2004086470 A1 * | 10/2004 |
| WO | 2005/093791 A1 | 10/2005 |

OTHER PUBLICATIONS

English Translation of DD 221563 A1.*
Translation of Application JP-2003-083329, upon which WO 2004/086470 claims priority.*

* cited by examiner

*Primary Examiner*—Hung Henry Nguyen
*Assistant Examiner*—Steven H Whitesell-Gordon
(74) *Attorney, Agent, or Firm*—Pillsbury Winthrop Shaw Pittman LLP

(57) ABSTRACT

An immersion lithographic apparatus has a barrier member surrounding a space between the projection system and the substrate so as to at least partly confine liquid in the space. A jet of liquid is directed radially inwardly in a gap between the barrier member and the substrate and/or between the barrier member and the projection system, to help prevent escape of liquid.

18 Claims, 4 Drawing Sheets

LITHOGRAPHIC APPARATUS AND DEVICE MANUFACTURING METHOD

FIELD

The present invention relates to a lithographic apparatus, a method for manufacturing a device and a method of calibrating a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as enabling the use of a larger effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

In immersion lithography, the immersion fluid, and particularly its confinement, may cause one or more problems. For example, evaporation of residual immersion liquid left on the substrate after exposures may cool the substrate and hence cause thermal contraction which may lead to overlay errors. This is a particular problem when water is used as the immersion liquid because water has a high latent heat of evaporation and evaporates readily in the warm, dry atmosphere usual in a clean room. Another significant problem is the presence of bubbles in the immersion liquid. These may arise through instability of the meniscus around the immersion liquid or by incomplete filling of one or more cavities and grooves around the substrate and/or one or more sensors in the substrate table.

SUMMARY

It is desirable, for example, to provide an improved immersion lithography apparatus.

According to an aspect of the invention, there is provided a lithographic apparatus, the apparatus comprising:

a projection system configured to project an image of a desired pattern through a liquid onto an image field;

a substrate table configured to hold a substrate so that a target portion on the substrate is positionable in the image field;

a barrier member configured to surround a space between the projection system and the substrate, the barrier member configured to at least partly confine liquid to the space and having a surface facing the substrate so as to define a gap between the barrier member and the substrate; and a nozzle for connection to a source of liquid, the nozzle shaped and oriented to direct a jet of liquid into the gap and substantially towards the center of the image field.

According to a further aspect of the invention, there is provided a device manufacturing method using a lithographic apparatus in which an image of a desired pattern is projected using a projection system through a liquid onto a substrate, the lithographic apparatus having a barrier member surrounding the liquid, the method comprising directing a jet of liquid into a gap between the barrier member and the substrate, or between the barrier member and the projection system, or between the barrier member and the substrate and the projection system, the jet of liquid configured to reduce liquid escaping through the gap.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
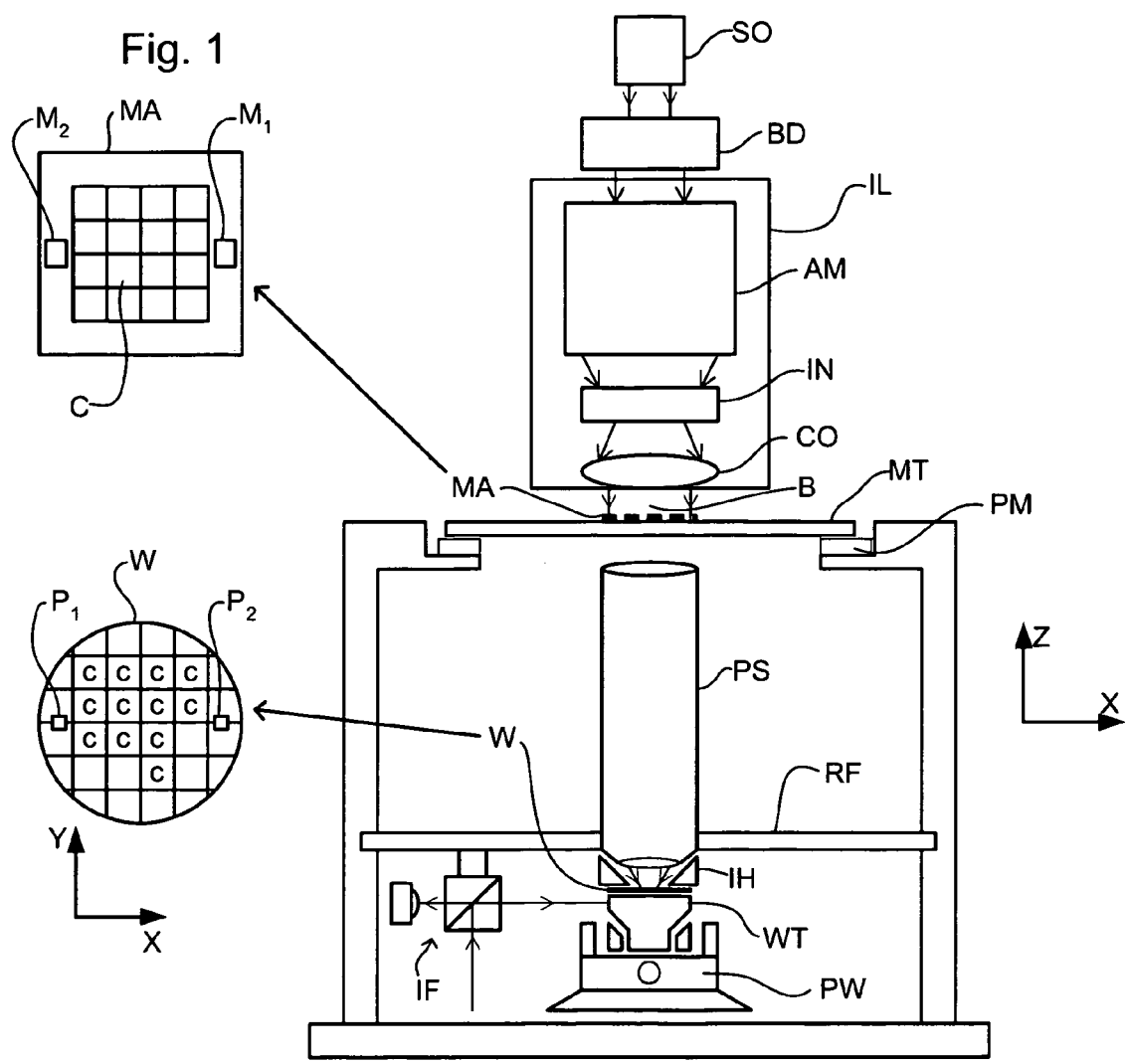
FIG. 1 depicts a lithographic apparatus according to an embodiment of the invention.
Figure 2:
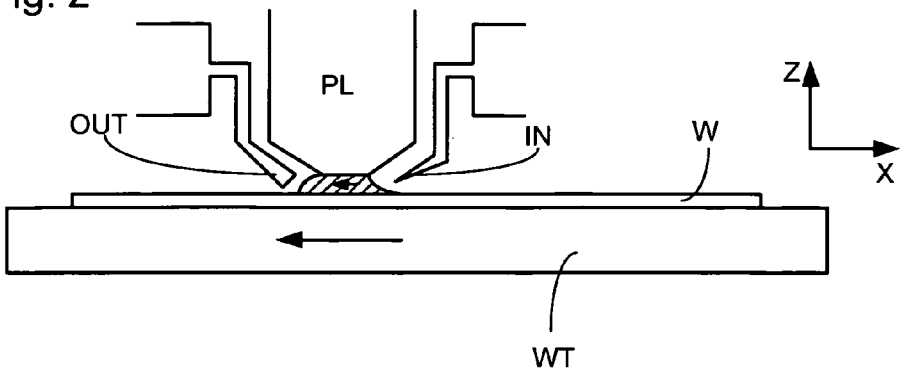
FIGS. 2 and 3 depict a liquid supply system for use in a lithographic projection apparatus.
Figure 3:
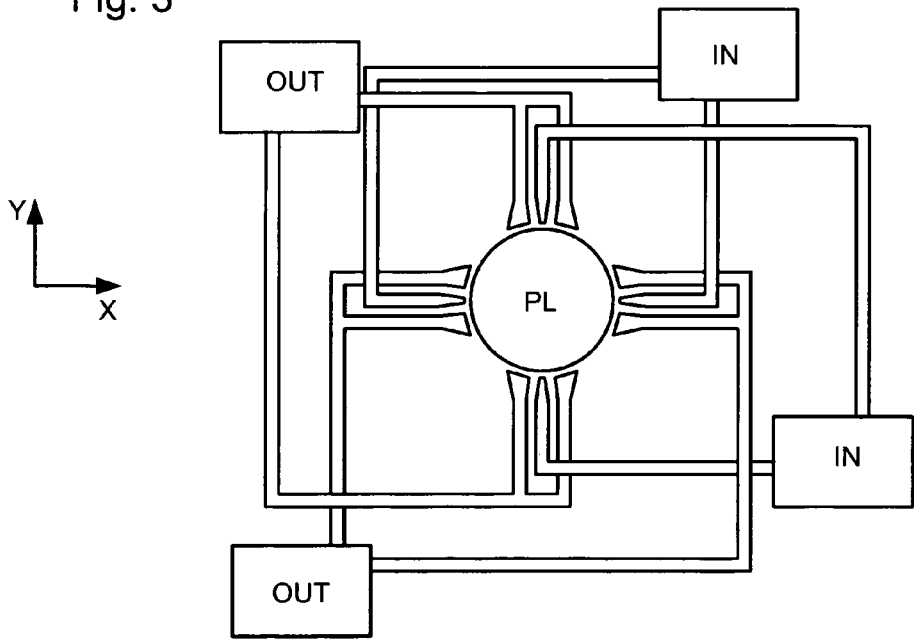
Figure 4:
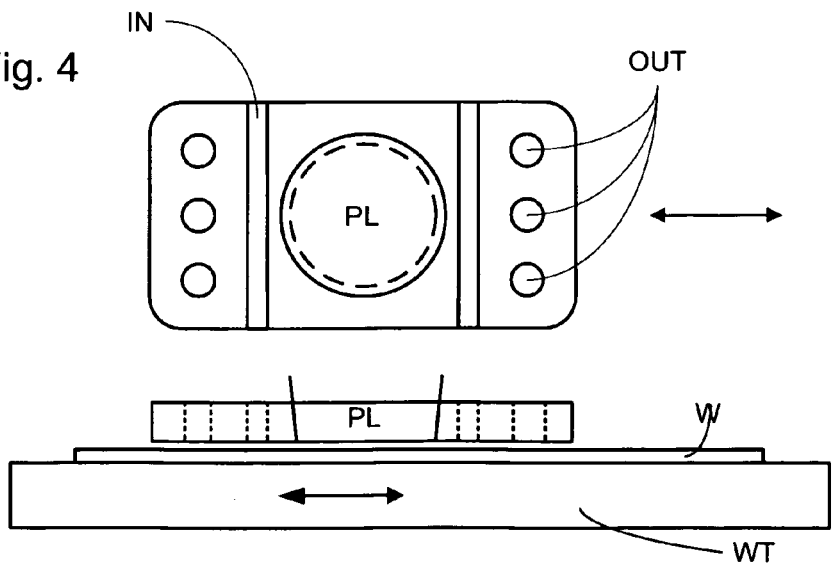
FIG. 4 depicts a further liquid supply system for use in a lithographic projection apparatus.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 5:
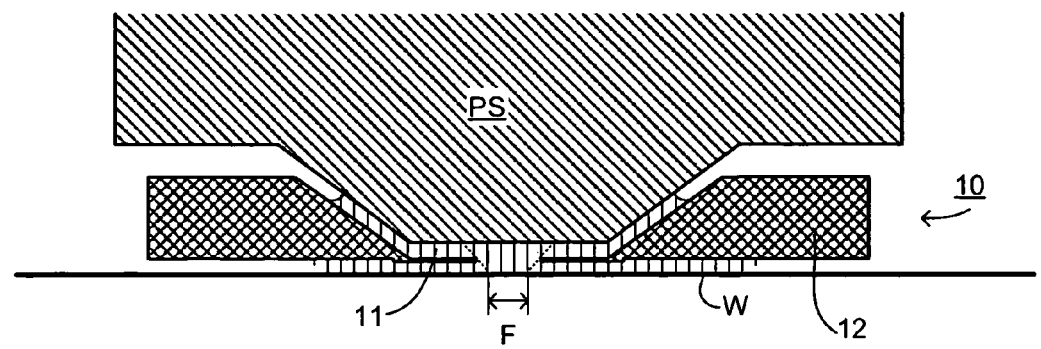
FIG. 5 depicts another liquid supply system for use in the lithographic projection apparatus of FIG. 1.

Another immersion lithography solution with a localized liquid supply system solution which has been proposed is to provide the liquid supply system with a barrier member which extends along at least a part of a boundary of the space between the final element of the projection system and the substrate table. Such a solution is illustrated in FIG. 5. The barrier member is substantially stationary relative to the projection system in the XY plane though there may be some relative movement in the Z direction (in the direction of the optical axis). In an embodiment, a seal is formed between the barrier member and the surface of the substrate and may be a contactless seal such as a gas seal. Such a system is disclosed in United States patent application publication no. US 2004-0207824, hereby incorporated in its entirety by reference.

As shown in FIG. 5, a liquid supply system 10 is used to supply liquid to the space between the final element of the projection system and the substrate. A barrier member 12 is configured to form a contactless seal to the substrate W around the image field of the projection system so that liquid is at least partly confined to fill a space between the substrate surface and the final element of the projection system PS. The barrier member 12 is positioned below and surrounding the final element of the projection system PS. Liquid is brought into the space below the projection system and within the barrier member 12. The barrier member 12 may extend a little above the final element of the projection system and the liquid level rises above the final element so that a buffer of liquid is provided. The barrier member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

In an embodiment, the liquid may be at least partly confined in the space by a gas seal formed, in use, between the bottom of the barrier member 12 and the surface of the substrate W. The gas seal is formed by gas, e.g. air or synthetic air but, in an embodiment, $N_2$ or another inert gas, provided under pressure to the gap between barrier member 12 and the substrate. The overpressure on a gas inlet, vacuum level on an outlet and geometry of the gap are arranged so that there is a high-velocity gas flow inwards that confines the liquid. However, while the gas seal is generally effective in confining the immersion liquid, the gas seal may contribute to one or more problems such as bubbles in the immersion liquid and/or evaporative cooling of the substrate.

In an embodiment of the present invention, a radially inward flow of immersion liquid is used to at least partly confine and localize the main body of immersion liquid beneath the final element of the projection system. The barrier member and liquid supply system is shown in more detail in FIG. 6, which is a cross-section through one side of the barrier member 12.

Figure 6:
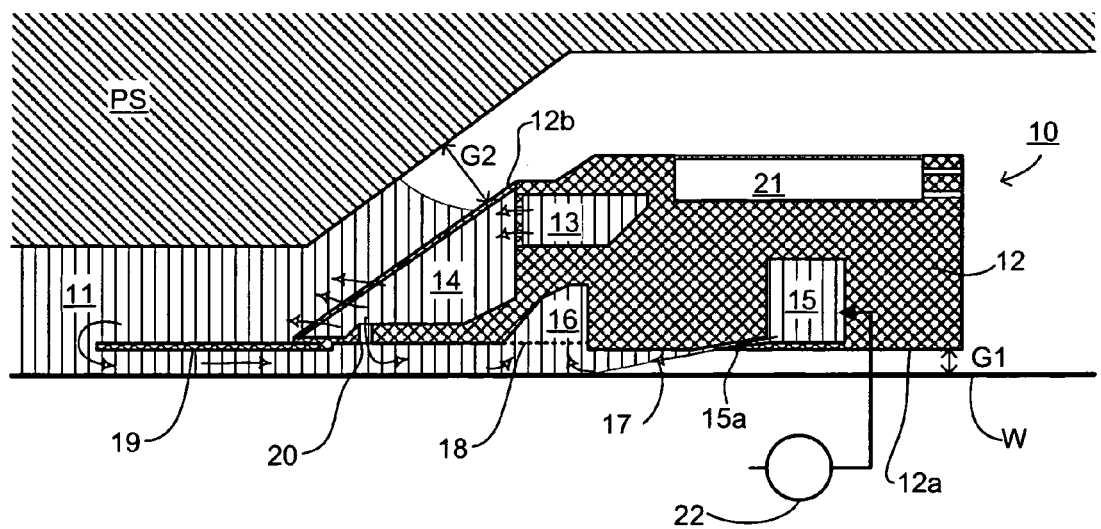
FIG. 6 is an enlarged view of part of the liquid supply system shown in FIG. 5.

As can be seen in FIGS. 5 and 6, in an embodiment, the projection system PS is basically cylindrical, with a frustoconical projection on its lower side to house the final element.

In this embodiment, the barrier member 12 is also basically cylindrical, with a central aperture matching and surrounding the frusto-conical projection of the projection system. It sits slightly above the substrate W, leaving a narrow gap G1 of height in the range of about 50 μm to 2 mm, for example between the lower surface 12a of the barrier member 12 and the substrate W. There is also a gap G2 between the inner surface 12b of the barrier member 12 and the projection system PS, which is somewhat larger, e.g. of a few mm. Within the barrier member 12 are various chambers and passages to supply liquid to and extract liquid from the space bounded by the final element of the projection system, the substrate and the barrier member. A plate 19, substantially flush with the lower surface 12a, covers most of the aperture in the barrier member 12 leaving only a small opening closely matching the image field F projected by the projection system PS. This plate assists in controlling the flow of liquid in the space and may be omitted if desired.

Supply of liquid is principally through conduit 13, which supplies liquid to (annular) chamber 14 which has one or more outlets to the space above plate 19 and also to gap G1 below the barrier member 12. Extraction of liquid is in normal conditions via drain 16, which is a (annular) chamber open at its lower side to the gap G1 beneath the barrier member 12. The lower side of the chamber 16 is closed by a micro-sieve 18 which serves to prevent bubbles that might be present in the liquid from entering the drain. In this way the flow through the drain is substantially liquid only, i.e. single phase, which may help reduce vibrations. If bubbles are found to be a problem, the sieve may be omitted and/or an additional extraction route for bubbles may be provided. In the top surface of the barrier member 12, a drain 21 is provided to extract any liquid that may overflow or be splashed out of the space, e.g. in the event of rapid upward movement of the substrate and/or barrier member.

Flow of liquid 11 out below the barrier member 12 is in part controlled by the fact that gap G1 is narrow. However, the gap cannot be closed because of the need for the substrate W to move relative to the projection system PS in all six degrees of freedom during scanned exposures. Thus there is a need to prevent liquid flowing through the gap, or deal with the liquid that does flow out. In an embodiment of an immersion lithography apparatus, a gas knife may be used to prevent outflow of liquid; in another or alternative proposal the liquid is allowed to flow out and dealt with by one or more drains or drying devices.

In this embodiment of the present invention, outflow of liquid is prevented or reduced by the provision of an inwardly-directed liquid jet 17. Liquid to form jet 17 is supplied from (annular) chamber 15, which has an opening 15a into gap G1. Opening 15a forms a nozzle and is so-shaped that liquid escaping through it under pressure forms a jet directed inwardly, i.e. generally towards the center of the image field F. The jet has a velocity and flow rate such that it exerts sufficient force, by momentum transfer, to substantially confine the liquid 11 and to prevent escape of liquid through gap G1. In an embodiment, it is desirable that the velocity of the liquid jet is greater than the relative speed of the substrate and projection system during a scanned exposure. The pressure and flow rate at which liquid is supplied to chamber 15 is controlled by liquid supply 22 accordingly. Supply 22 may be the same supply that supplies liquid to the main space, via conduit 13, or may be a separate supply. In an embodiment, the supply 22 is pump configured to pump liquid from a liquid source. In place of the single opening 15a that extends all the way around the barrier member 12, a plurality of closely spaced openings, such that the resultant jets merge to form a combined jet surrounding the space, may be provided.

Figure 7:
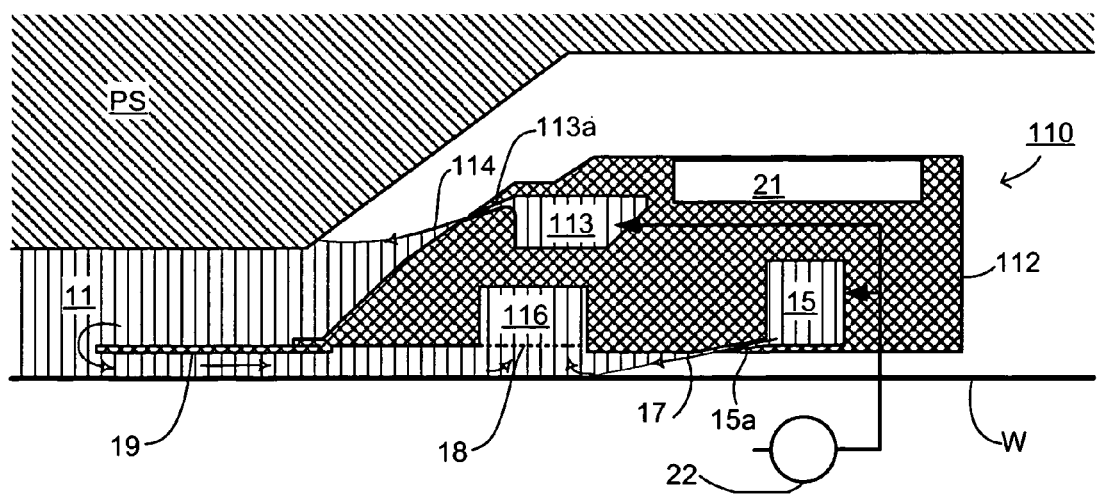
FIG. 7 is a view similar to FIG. 6 of the liquid supply system of another embodiment of the invention.

In an embodiment of the invention, shown in FIG. 7, the main supply of liquid to the space between the projection system and the substrate W is also by an inwardly directed liquid jet. In the second embodiment, parts that are the same or equivalent to those of the embodiment described with respect to FIG. 6 are identified by like reference numerals and are not described further below.

In place of conduit 13 and chamber 14, in the second embodiment, a single (annular) conduit 113 is provided in the upper part of the barrier member 12 with one opening, or a plurality of closely spaced openings, 113a so that when liquid under pressure is supplied to conduit 113, it emerges as a jet 114 directed towards the center of the image field. The jet 114 prevents liquid splashing over the barrier member in normal circumstances. Overflow drain 21 remains to deal with any overflow that may occur in abnormal circumstances and may be omitted if not necessary. In an embodiment of the invention, the velocity of liquid in the second jet is greater than about 0.5 m/s to maintain a stable meniscus. In an embodiment, the conduit 13 and the chamber 14 with one or more openings of FIG. 6 may be combined with the chamber 113 and nozzle 113a where the chamber 14 provides a flow of liquid through its opening(s) and chamber 113 provides the jet 114 through nozzle 113a.

Figure 8:
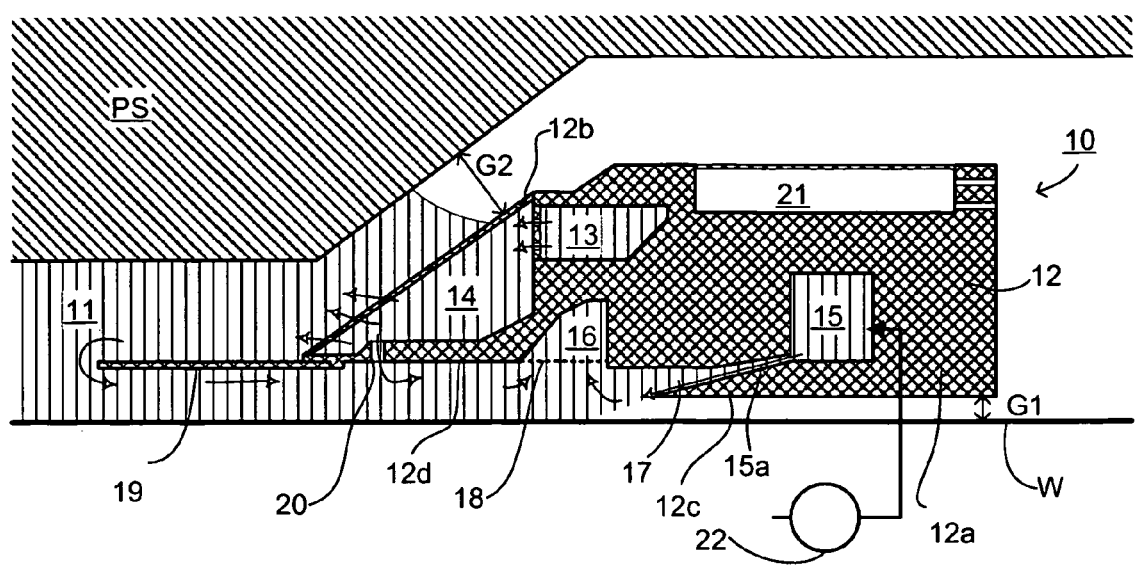
FIG. 8 is a view similar to FIG. 6 of the liquid supply system of a further embodiment of the invention.

An embodiment of the invention, shown in FIG. 8, is similar to the embodiment described with respect to FIG. 6 but the lower surface of the barrier member 12 (i.e. that facing the substrate) is not flat. In particular, the part of the surface 12c radially outward of the jet 17 is lower (i.e. closer to the substrate) than the part 12d that is radially inward of the jet 17. The gap G1 between the substrate and outer part 12c determines the rate of leakage (if any) of immersion liquid 11 and is therefore, in an embodiment, kept narrow, however the inner part 12d may define a wider gap, without increasing or causing leakage. This provides additional room for the liquid jet 17 and the resulting flow of liquid. A similar arrangement may be effected in the embodiments described above as well.

The liquid jet of an embodiment of the present invention helps to alleviate or solve one or more problems in that by substantially confining the liquid with a liquid jet, high velocity gas flows may be avoided. This may prevent one or more problems that may occur due to evaporative drying of residual liquid and/or due to formation of bubbles in an unstable meniscus. One or more additional advantages may be achieved if the liquid is accurately temperature controlled— increased liquid flow, as compared to liquid supply arrangements using a gas flow to at least partly confine the immersion liquid, may reduce temperature deviations in the substrate. Furthermore, the increased liquid flow from the jet to a drain may serve to improve removal of contaminants, including in some cases bubbles, from the immersion liquid. Where a second liquid jet, in the upper surface of the barrier member is provided, this may help to set up a liquid flow that drives contaminants, especially rising bubbles, towards the drain 16.

In an embodiment of the invention, two or more concentric liquid jet rings may be used to further improve liquid confinement. Multiple liquid jets may be used with a single drain or multiple concentric drains. It may also be possible to use another liquid, desirably immiscible with the immersion liquid, in the liquid jet(s) to confine the immersion liquid.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, the apparatus comprising:
   a projection system configured to project an image of a desired pattern through a liquid onto an image field;
   a substrate table configured to hold a substrate so that a target portion on the substrate is positionable in the image field;
   a barrier member configured to surround a space between the projection system and the substrate, the substrate table, or both the substrate and the substrate table, the barrier member configured to at least partly confine liquid to the space and having a surface facing the substrate, the substrate table, or both the substrate and the substrate table, so as to define a gap between the barrier member and the substrate, the substrate table, or both the substrate and the substrate table;
   a nozzle for connection to a source of liquid, the nozzle shaped and oriented to direct a jet of liquid into the gap and substantially towards the center of the image field so as to confine radially inward of the nozzle substantially all liquid at the nozzle; and
   a liquid supply connected to the nozzle and arranged to supply liquid to the nozzle at a pressure such that a rate of momentum transfer from the jet to the liquid confined in the space is sufficient to prevent liquid flowing away from the space, escaping through the gap.

2. The apparatus of claim 1, wherein the nozzle is substantially annular and substantially surrounds the image field.

3. The apparatus of claim 1, wherein there are a plurality of nozzles spaced around the barrier member so as to substantially surround the image field.

4. The apparatus of claim 1, wherein the liquid supply connected to the nozzle is arranged to supply liquid to the nozzle at a pressure such that a velocity of the liquid is greater than a relative speed of the substrate and the projection system during a scanned exposure.

5. The apparatus of claim 1, further comprising a suction device in fluid communication with the space and arranged to extract liquid therefrom.

6. The apparatus of claim 1, wherein the barrier member has a second surface facing the projection system and defining a second gap between the barrier member and the projection system and the apparatus further comprises a second nozzle for connection to a source of liquid, the second nozzle shaped and oriented to direct a second jet of liquid into the second gap and substantially towards the center of the image field.

7. The apparatus of claim 6, wherein the second nozzle is substantially annular and substantially surrounds the image field.

8. The apparatus of claim 6, wherein there are a plurality of second nozzles spaced around the barrier member so as to substantially surround the image field.

9. The apparatus of claim 6, further comprising a liquid supply connected to the second nozzle and arranged to supply liquid to the second nozzle at a pressure such that a rate of momentum transfer from the second jet to the liquid confined in the space is sufficient to prevent liquid escaping from the space through the second gap.

10. The apparatus of claim 6, further comprising a liquid supply connected to the second nozzle and arranged to supply liquid to the second nozzle at a pressure such that a velocity of the liquid is greater than about 0.5 m/s.

11. The apparatus of claim 1, wherein, in use, the gap between the barrier member and the substrate, the substrate table, or both the substrate and the substrate table, radially inwardly of the nozzle towards the image field is larger than the gap between the barrier member and the substrate, the substrate table, or both the substrate and the substrate table, radially outwardly away from the image field.

12. A device manufacturing method using a lithographic apparatus in which an image of a desired pattern is projected using a projection system through a liquid onto a substrate, the lithographic apparatus having a barrier member surrounding the liquid, the method comprising directing a jet of liquid into a gap between the barrier member and the substrate, or between the barrier member and the projection system, or between the barrier member and the substrate and the projection system, so as to confine radially inward of the nozzle substantially all liquid at the nozzle and supplying liquid to the jet at a pressure such that a rate of momentum transfer from the jet to the liquid surrounded by the barrier member is sufficient to prevent liquid flowing away, escaping from the liquid surrounded by the barrier member through the gap.

13. The method of claim 12, wherein the jet of liquid substantially surrounds the image field.

14. The method of claim 12, further comprising supplying liquid to the jet, directing liquid into a gap between the barrier member and the substrate, at a pressure such that a velocity of the liquid is greater than a relative speed of the substrate and the projection system during a scanned exposure.

15. The method of claim 12, further comprising extracting liquid from the liquid surrounded by the barrier member.

16. The method of claim 12, further comprising supplying liquid to the jet, directing liquid into the gap between the barrier member and the projection system, at a pressure such that a velocity of the liquid is greater than about 0.5 m/s.

17. The method of claim 12, wherein the gap between the barrier member and the substrate radially inwardly of the nozzle towards the image field is larger than the gap between the barrier member and the substrate radially outwardly away from the image field.

18. A device manufacturing method using a lithographic apparatus in which an image of a desired pattern is projected using a projection system through a liquid onto a substrate, the lithographic apparatus having a barrier member surrounding the liquid, the method comprising directing a jet of liquid into a gap between the barrier member and the substrate, the jet of liquid configured to reduce liquid escaping through the gap and the jet of liquid coming from an opening which is the most radially outward positioned opening defined in a lower surface of the barrier member.

* * * * *